(12) United States Patent
Hull et al.

(10) Patent No.: US 9,404,948 B2
(45) Date of Patent: Aug. 2, 2016

(54) MAINS VOLTAGE ZERO-CROSSING DETECTOR

(71) Applicant: Microchip Technology Incorporated, Chandler, AZ (US)

(72) Inventors: Richard Hull, Puyallup, WA (US); John Charais, Phoenix, AZ (US); Gabriel Rosca, Ploiesti (RO)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 407 days.

(21) Appl. No.: 14/135,351

(22) Filed: Dec. 19, 2013

(65) Prior Publication Data

US 2014/0176119 A1    Jun. 26, 2014

Related U.S. Application Data

(60) Provisional application No. 61/745,320, filed on Dec. 21, 2012.

(51) Int. Cl.
*G01R 19/175*    (2006.01)
*H03K 5/1536*    (2006.01)

(52) U.S. Cl.
CPC .................................. *G01R 19/175* (2013.01)

(58) Field of Classification Search
CPC ............................ G01R 19/175; H03K 5/1536
USPC ........................................................... 327/79
See application file for complete search history.

(56) References Cited

U.S. PATENT DOCUMENTS

| | | | | |
|---|---|---|---|---|
| 3,693,027 A | * | 9/1972 | Garaway | H02M 1/083 323/902 |
| 4,051,394 A | * | 9/1977 | Tieden | H03K 17/136 327/481 |
| 4,176,288 A | * | 11/1979 | Komatsu | H03K 17/79 323/239 |
| 4,229,669 A | * | 10/1980 | Smith | H03K 5/1536 327/451 |
| 4,345,169 A | | 8/1982 | Saleh | 327/72 |
| 5,329,171 A | * | 7/1994 | Shimizu | H03K 5/2481 327/78 |
| 5,410,193 A | * | 4/1995 | Backus | H03K 17/16 327/451 |
| 7,236,383 B2 | | 6/2007 | Peron | 363/125 |
| 7,508,240 B1 | * | 3/2009 | Yurick | H03K 5/1536 327/79 |
| 7,940,090 B2 | * | 5/2011 | Yoshida | H03K 17/13 327/79 |
| 8,058,852 B2 | | 11/2011 | Kang et al. | 323/235 |
| 2003/0161465 A1 | | 8/2003 | Nakamura | 379/377 |

OTHER PUBLICATIONS

International Search Report and Written Opinion, Application No. PCT/US2013/076828, 11 pages, Apr. 7, 2014.

* cited by examiner

*Primary Examiner* — Kenneth B Wells
(74) *Attorney, Agent, or Firm* — Slayden Grubert Beard PLLC (57) ABSTRACT

A mains voltage zero-crossing detector has a constant voltage forced on an external node by driving transistor devices with appropriate control signals provided by a feedback loop around a highly power efficient class B configuration comprising an operational amplifier having single ended dual outputs and a class B control circuit. Mains power zero crossings may then be detected by monitoring the drive current of devices driven by this amplifier. Wherein Class B control and current mode detection provide accurate detection of the driven signal without depending on any voltage threshold that may depend on temperature, process fabrication and/or supply voltage.

29 Claims, 5 Drawing Sheets

Figure 1 (Prior Technology)

Figure 2 (Prior Technology)

Figure 3 (Prior Technology)

MAINS VOLTAGE ZERO-CROSSING DETECTOR

RELATED PATENT APPLICATION

This application claims priority to commonly owned U.S. Provisional Patent Application No. 61/745,320; filed Dec. 21, 2012; which is hereby incorporated by reference herein for all purposes.

TECHNICAL FIELD

The present disclosure relates to an alternating current (AC) zero crossing detector, in particular, a power mains zero crossing detector module in an integrated circuit having a sensing input wherein a voltage is maintained within supply rail voltages of the integrated circuit.

BACKGROUND

There are many applications for a circuit that monitors power mains voltage zero-crossings, e.g., appliance control circuits. Zero-crossing detection may be used in for example, but is not limited to, timing delays for firing TRIACS, pulse skipping to reduce EMI, etc., and alternating current (AC) mains frequency is more accurate over a long period of time than a crystal controlled oscillator.

Figure 1:
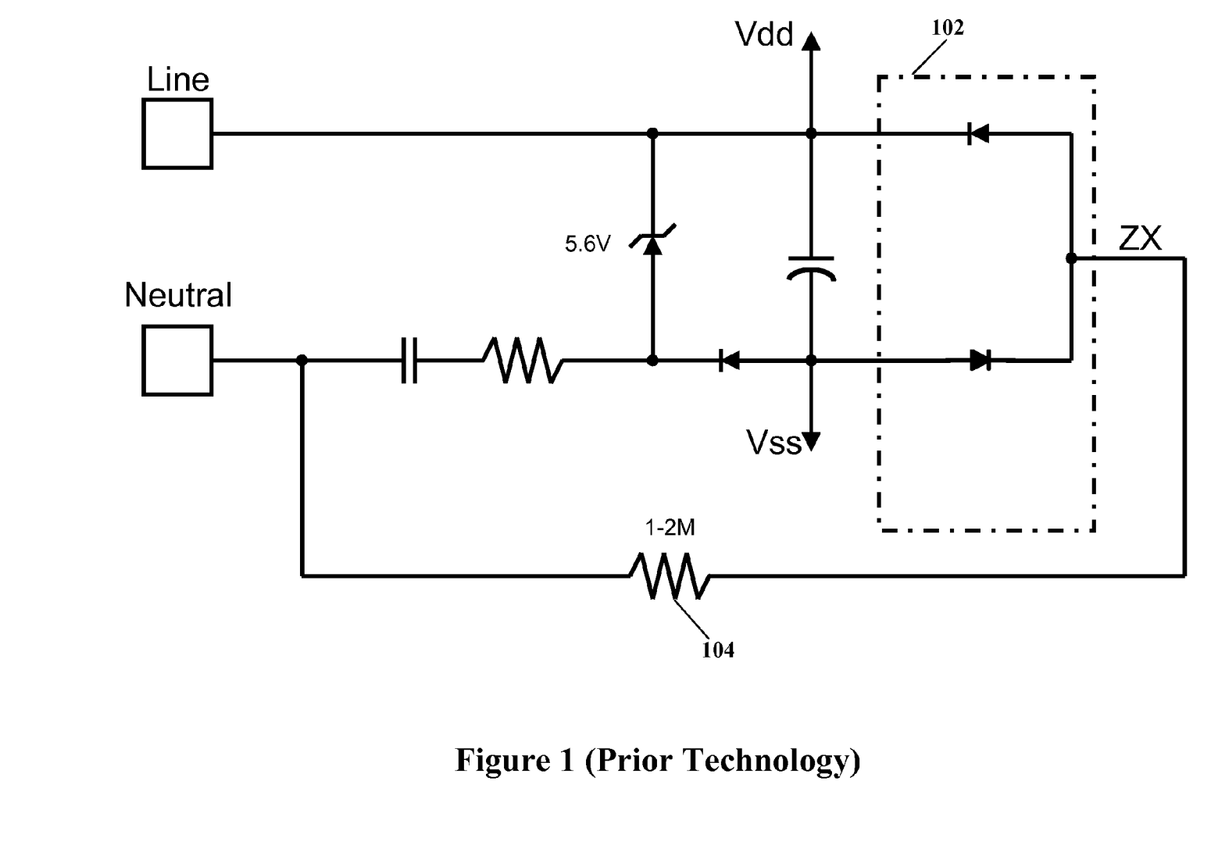
FIG. 1 illustrates an exemplary prior technology schematic diagram of a conventional digital device having inputs coupled to a power mains through external components.
Figure 2:
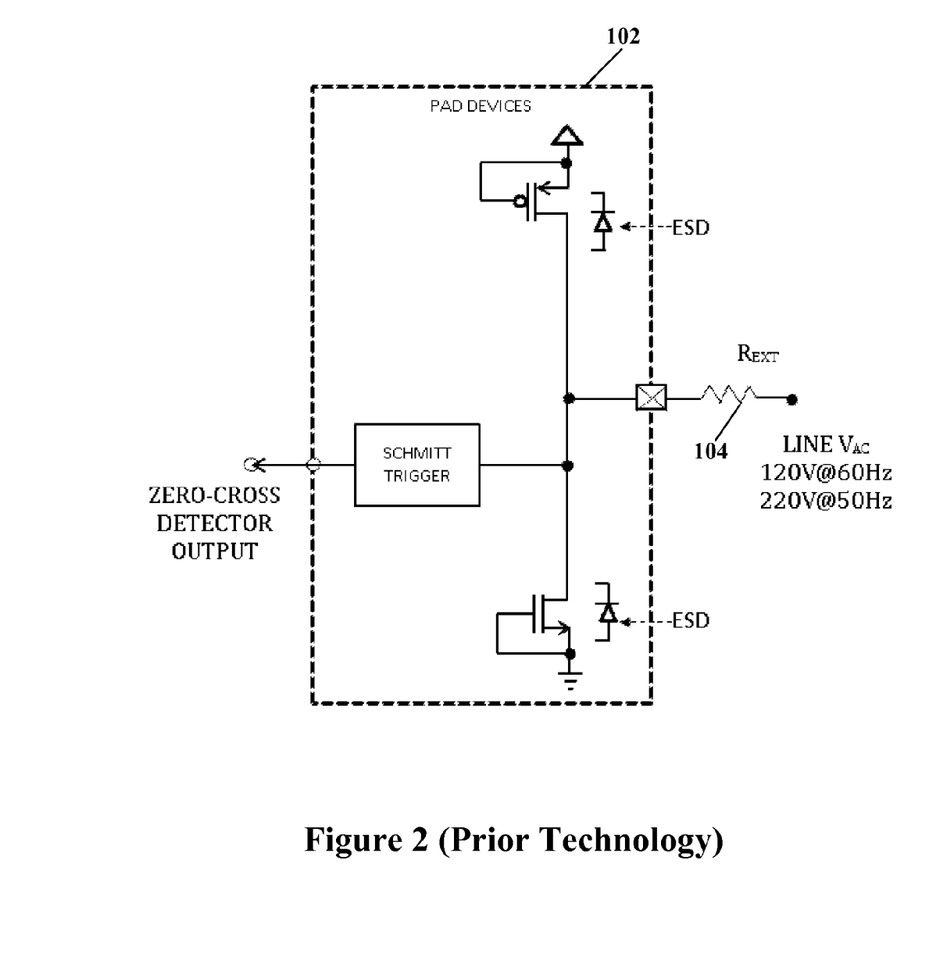
FIG. 2 illustrates an exemplary prior technology schematic diagram of an input structure of the conventional digital device shown in FIG. 1.

Referring to FIG. 1, depicted is an exemplary prior technology schematic diagram of a conventional digital device having inputs coupled to a power mains through external components. A conventional input/output port of a digital device 102 such as a digital I/O port of a microcontroller may be coupled to a power mains line through a high value impedance such as a 1 to 2 megohm resistor 104. Referring to FIG. 2, depicted is an exemplary prior technology schematic diagram of an input structure of the conventional digital device shown in FIG. 1. To perform zero-crossing detection an integrated Schmitt trigger may be coupled to the I/O port (node), for example, by programming a respective configuration register that allows such an internal coupling. When the mains power line voltage changes its sign the detector output must change its state. Currently this is sensed as a digital input. Some modules may be disturbed by injected current when the parasitic diodes conduct in the integrated circuit die of the digital device caused by the excess voltage at the input port from the voltage dropping resistor 104. This injected current may cause an undesirable disturbance in the device.

Figure 3:
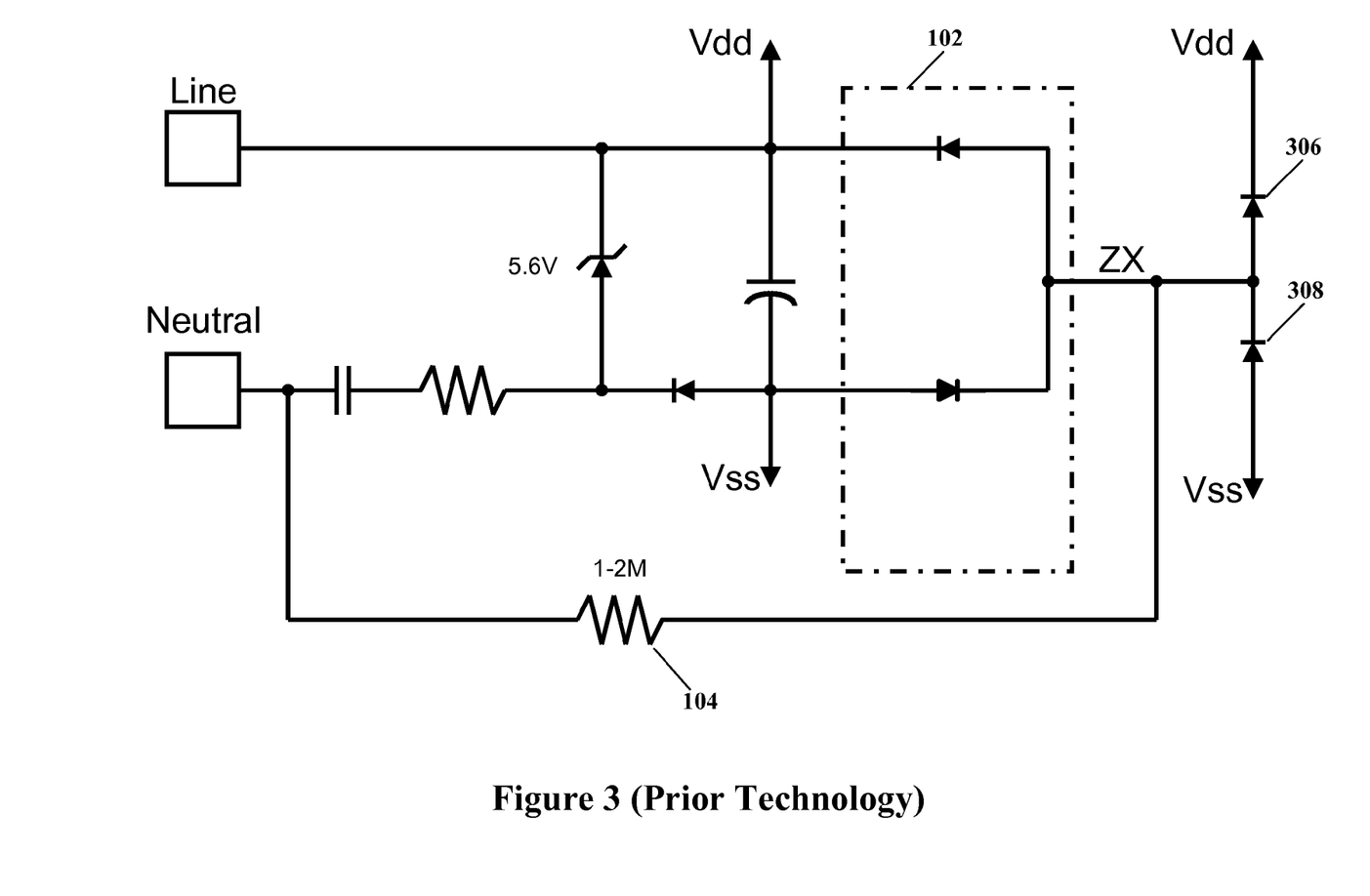
FIG. 3 illustrates an exemplary prior technology schematic diagram of an input protection circuit using external components for the conventional digital device shown in FIG. 1.

Referring to FIG. 3, depicted is an exemplary prior technology schematic diagram of an input protection circuit using external components for the conventional digital device shown in FIG. 1. External diodes 306 and 308 may be added as shown in FIG. 3, but they must be Schottky diodes to make sure that the input voltage does not reach a level such that undesirable diode conduction may occur in the internal (inside 102) diodes to Vdd and/or Vss. Using such external components causes an increase in printed circuit board size and complexity, and the bill of materials will be increased which is undesirable for many cost critical applications.

SUMMARY

Therefore, a need exists for a power mains zero-crossing detector module in a general purpose analog and digital capable (mixed signal) integrated circuit device, e.g., microcontroller, that provides detection of zero crossings of a power mains voltage without exceeding maximum input voltages for the integrated circuit and that will not cause input electrostatic discharge (ESD) protection devices, or any device, within the integrated circuit device to diode conduct. Such a module should be implemented in an effective way having in mind silicon area economy, low power consumption, circuit simplicity, no requirement for external protection circuitry and robustness of operation.

According to an embodiment, a mains voltage zero-crossing detector may comprise: a first output driver coupled between a first rail voltage and an external node; a second output driver coupled between a second rail voltage and the external node; an amplifier having first and second differential inputs, and first and second single ended outputs, wherein a first output thereof may be coupled to a control input of the first output driver and a second output thereof may be coupled to a control input of the second output driver; a feedback network coupled between the output node and the second input of the amplifier; a voltage reference coupled to the first input of the amplifier; a class B control circuit coupled to the control inputs of the first and second output drivers, wherein the class B control circuit forces one of the first or second output drivers off when the other output driver may be conducting, and releases control back to the amplifier as it stops conducting; a current mode detector circuit coupled to the control inputs of the first and second output drivers, wherein the current mode detector circuit provides mains voltage zero-crossing detection based upon currents to control inputs of the first and second output drivers.

According to a further embodiment, the first output driver may be a P-channel metal oxide semiconductor field effect transistor (MOSFET) and the second output driver may be an N-channel MOSFET. According to a further embodiment, a reference voltage from the voltage reference may be between the first and second voltage rails. According to a further embodiment, the class B control circuit may override one of the first or second single ended outputs of the amplifier to substantially turn off the respective first or second output driver when the other one of the first or second single ended outputs of the amplifier may be controlling its respective one of the control inputs of the first or second output driver, thereby substantially reducing shoot through current. According to a further embodiment, the current mode detection circuit may comprise an input buffer having separate N-channel MOSFET and P-channel MOSFET inputs coupled to a Schmitt trigger circuit. According to a further embodiment, the amplifier may be an operational amplifier. According to a further embodiment, the external node may be coupled to a mains voltage through a high impedance. According to a further embodiment, the amplifier may comprise a single output and the first and second outputs may be provided through first and second resistors coupled to respective control inputs of the first and second output drivers.

According to another embodiment, a circuit arrangement for detecting mains voltage zero-crossings may comprise: an external node of an integrated circuit device that may be configured for coupling to a mains power alternating current (AC) voltage through a high value impedance; first and second output drivers that may be operable to couple the external node to either a first supply rail voltage or second supply rail voltage; and a zero-crossing detector that may provide control of the first and second output drivers such that a substantially constant voltage may be forced at the external node whether current is sinked from or sourced to the mains AC voltage, and a current thereof may be monitored in determining voltage zero-crossings of the mains AC voltage.

According to a further embodiment, the output drivers may be part of a digital input/output port that may be programmable to operate the external node as a digital output port, a digital input port, or a zero crossing detector input port. According to a further embodiment, a configuration register may be provided that determines a function of said external node. According to a further embodiment, the constant voltage may be controlled by a feedback loop around a class B controlled operational amplifier. According to a further embodiment, the class B controlled first and second output drivers operate power efficiently. According to a further embodiment, the zero-crossing detector may be operable to monitor current driven to the first and second output drivers. According to a further embodiment, the zero-crossing detection may be independent of operating temperature, process manufacturing and supply voltage.

According to a further embodiment, the high value impedance may be a high value resistor. According to a further embodiment, the high value impedance may be selected from any one or more of the group consisting of a resistor, a capacitor, a transistor, and an inductor. According to a further embodiment, the high value impedance may be a combination of passive and active components.

According to a further embodiment, a digital filter may be coupled to the zero-crossing detector. According to a further embodiment, the digital filter has a hold off time of substantially less than twice the mains power AC frequency.

According to yet another embodiment, a method for detecting mains voltage zero-crossings may comprise the steps of: configuring an external node of an integrated circuit device for coupling to a mains power alternating current (AC) voltage through a high value impedance; providing first and second output drivers operable to couple the external node to either a first supply rail voltage or second supply rail voltage; and providing a zero-crossing detector output to control inputs of the first and second output drivers such that a substantially constant voltage may be forced at the external node whether current is being sinked from or sourced to the mains AC voltage; and monitoring current of signals controlling the first and second output drivers for determining voltage zero-crossings of the mains AC voltage.

According to a further embodiment of the method may comprise the step of filtering the monitored current of the signals controlling the first and second output drivers with a digital filter. According to a further embodiment of the method, the digital filter has a hold off time of substantially less than twice the mains power AC frequency. According to a further embodiment of the method, the step of configuring the node of the integrated circuit device for coupling to the mains power alternating current (AC) voltage through the high value impedance may be done at power up of the integrated circuit device. According to a further embodiment of the method, the step of configuring the node of the integrated circuit device for coupling to the mains power alternating current (AC) voltage through the high value impedance may be done after power up of the integrated circuit device. A further embodiment of the method may comprise the step of disabling the node of the integrated circuit device coupled to the mains power alternating current (AC) voltage through the high value impedance after power up of the integrated circuit device. According to a further embodiment of the method, the step of configuring the node of the integrated circuit device for coupling to the mains power alternating current (AC) voltage through the high value impedance may be done with at one least configuration fuse without having to execute a program code.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments a constant voltage is forced on an external node by driving transistor devices with appropriate control signals provided by a feedback loop around a highly power efficient class B configuration comprising an operational amplifier having single ended dual outputs and a class B control circuit. Mains power zero crossing may then be detected by monitoring the current drive of devices attached to the output of this amplifier. Wherein Class B control and current mode detection provide accurate detection of the driven signal without depending on any voltage threshold that may be depend on temperature, process fabrication and/or supply voltage.

According to various embodiments, all drawbacks of the conventional prior technology mains power zero-crossing detection circuits, including the necessity of external protection components may be eliminated. The input node voltage never exceeds the power supply voltage rails, and operation of surrounding analog and digital modules in the integrated circuit device, even if very sensitive, is not affected. Using current mode detection is extremely accurate while sensing the mains power crossover event while the instantaneous line voltage $V_{AC}$ is still within the digital device supply voltage rails range.

According to various embodiments, an external high value impedance may couple a zero-crossing detector module input node to a mains power line. The zero-crossing detector may keep the input node coupled to the external high value impedance at a constant voltage level that is always between supply rails, e.g., Vdd and Vss, in order to prevent firing-up the ESD structures protecting the node and thereby avoid disturbing other sensitive analog functions within the integrated circuit device. At the same time the zero-crossing detector may monitor the current through the external high value impedance and may change its output state when the mains voltage crosses a reference value close to zero volts, e.g., when a zero-crossing event of the mains power line occurs.

The zero-crossing detector module may accommodate many applications in combination with a microcontroller. Hence an integrated peripheral performing this function would be desirable. For example, such a function may be used for performing timing delays for firing TRIACS, for pulse skipping (reduces EMI), or as a frequency constant since the frequency of the AC mains is more accurate over a long period of time than a crystal oscillator.

According to a further embodiment, output drivers may be part of a microcontroller digital input/output node (port) that may be programmable to operate as a digital output port, a digital input port, or as a zero crossing detector. According to a further embodiment, a configuration register may determine the function of said external node. According to a further embodiment, constant voltage control at the node may be provided by control signals from a feedback loop around a class B controlled operational amplifier. According to a further embodiment, the class B controlled operational amplifier in combination with the output drivers may be power efficient. According to a further embodiment, the zero crossing detector may be operable to monitor the current drive of the operational amplifier. According to a further embodiment, the zero crossing detection is independent from temperature, process and supply voltage. According to a further embodiment, a microcontroller may comprise a circuit arrangement in the embodiment described more fully hereinbelow.

Referring now to the drawings, the details of specific example embodiments are schematically illustrated. Like elements in the drawings will be represented by like numbers, and similar elements will be represented by like numbers with a different lower case letter suffix.

Figure 4:
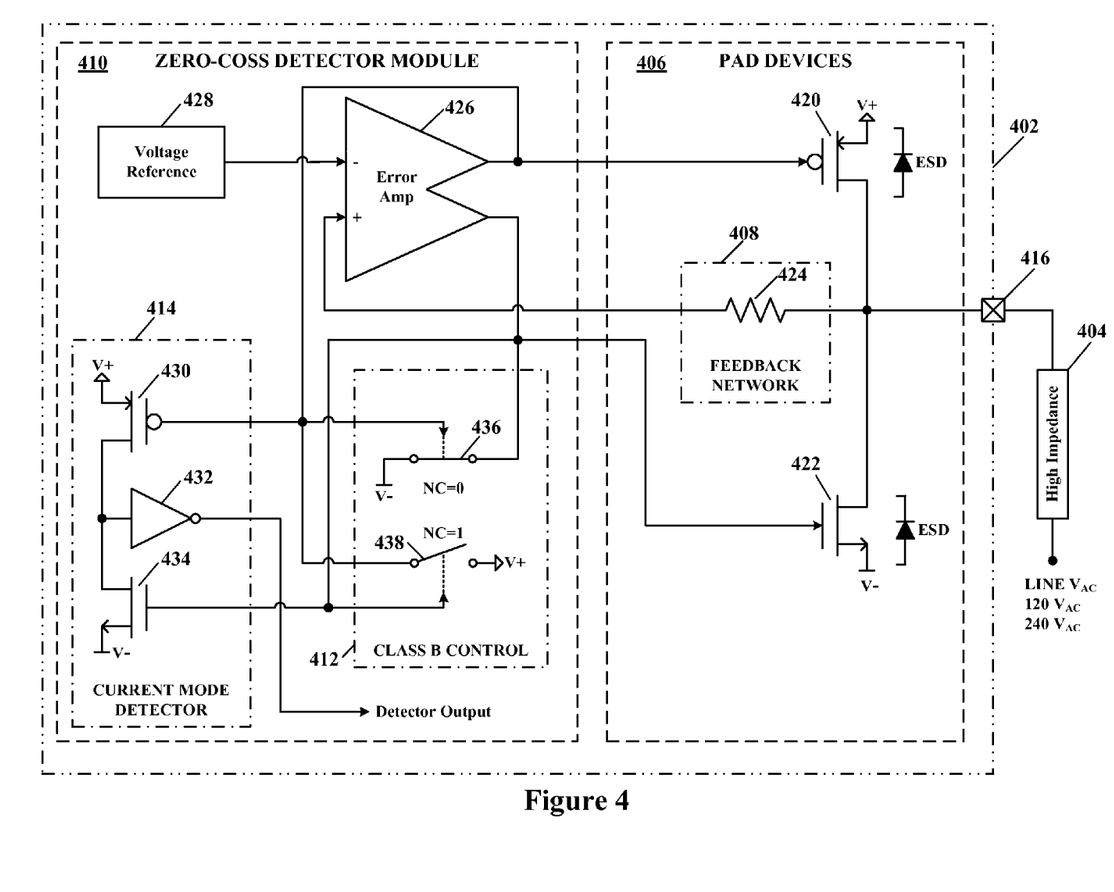
FIG. 4 illustrates a schematic diagram of a mains voltage zero-crossing detector, according to a specific example embodiment of this disclosure.

Referring to FIG. 4, depicted is a schematic diagram of a mains voltage zero-crossing detector, according to a specific example embodiment of this disclosure. A mixed signal device 402, e.g., microcontroller, may comprise pad devices 406 and a zero-crossing detector module 410. An external high value impedance 404, e.g., 1 to 2 megohms, may couple an input node 416 of the pad devices 406 to a mains power line voltage, e.g., 120 $V_{AC}$ or 240 $V_{AC}$. It is contemplated and within the scope of this disclosure that the external high impedance 404 may be any combination of a resistor(s), a capacitor(s), transistors, and/or an inductor(s), and one having ordinary skill in the art of electronic circuit design and the benefit of this disclosure would readily be able to design an appropriate external high impedance network.

The pad devices 406 may comprise a P-channel metal oxide semiconductor field effect transistor (MOSFET) 420, an N-channel MOSFET 422 and a feedback network 408. Electrostatic discharge (ESD) protection devices may also be coupled to the input node 416 for electrostatic protection thereof. The feedback network 408 may comprise a resistor 424. However, it is contemplated and within the scope of this disclosure that the feedback network 408 may be any combination of a resistor(s), a capacitor(s), transistors, and/or an inductor(s), and one having ordinary skill in the art of electronic circuit design and the benefit of this disclosure would readily be able to design an appropriate feedback network 408. It is also contemplated and within the scope of this disclosure that the node 416 may be a standard configurable digital input-output node that may be configured as digital output port, a digital input port, or a zero crossing detector input port and/or other digital and analog functions. In addition, this configuration may be stored in a configuration register (not shown) of the digital device 402.

The zero-crossing detector module 410 may comprise an error amplifier 426 having differential first and second inputs and two single ended outputs, a voltage reference 428 coupled to the first input of the error amplifier 426, a class B control circuit 412, and a current mode detector 414. The feedback network 408, e.g., resistor 424, may couple a voltage at the input node 416 to the second input of the error amplifier 426. The error amplifier 426 may comprise differential inputs and single ended double outputs providing the same phase, and may function as a voltage buffer to control the gates of the P-channel MOSFET 420 and the N-channel MOSFET 422 so as to maintain a voltage at the input node 416 substantially the same as a reference voltage from the voltage reference 428. The amount of current required to maintain this voltage at the input node 416 varies as the mains power line voltage changes. Without the class B control circuit 412, both gate voltages of the P-channel MOSFET 420 and the N-channel MOSFET 422 would be approximately equal, resulting in a very high shoot-through current, wherein the current mode detector 414 would have a much harder time making a "zero-crossing" decision.

It is contemplated and within the scope of this disclosure that the error amplifier 426 may alternatively comprise differential inputs and a single output wherein the single output may be coupled to the gate of the P-channel MOSFET 420 with a first resistor (not shown) and to the gate of the N-channel MOSFET 422 with a second resistor (not shown).

The class B control circuit 412 may comprise a first switch 436 and a second switch 438. The first and second switches 436 and 438 may be implemented with transistors, e.g., field effect transistors. When there is a substantially logic zero level applied to the first switch 436 it will be closed (on) and when at a logic high level ("1") it will be open (off). When there is a logic low level ("0") applied to the first switch 436 it will be closed (on) and when at a logic high level ("1") it will be open (off). When the first switch 436 is closed, the N-channel MOSFET 422 will be hard "off," and when the second switch 438 is closed, the P-channel MOSFET 420 will be hard "off." When either one or both of the first or second switches 436 and 438 are open then the respective outputs of the error amplifier 426 will control conduction of the P-channel MOSFET 420 and the N-channel MOSFET 422. When switch 436 is closed it will dominate control of the N-channel MOSFET 422 over control by the error amplifier 426. When switch 438 is closed it will dominate control of the P-channel MOSFET 420 over control by the error amplifier 426. The class B control circuit 412 shuts down the un-needed driver transistor, e.g., P-channel MOSFET 420 or N-channel MOSFET 422 (based upon what direction the mains power line voltage has gone, thereby greatly reducing shoot-through current from V+ to V− through P-channel MOSFET 420 and N-channel MOSFET 422. This provides a significant reduction in total power consumption, and helps the current mode detector 414 to make a quicker and more accurate current mode detection of the mains AC waveform zero-crossing (waveform direction).

For example: When the error amplifier 426 drives the gate of the P-channel MOSFET 420 low enough to turn it on, the Class B control circuit 412 will pull down the gate of the N-channel MOSFET 422 so that it cannot conduct (the N-channel MOSFET 422 isn't needed when the P-channel MOSFET 420 is pulling the input node 416 up to the reference voltage because the external line voltage is negative). When the error amplifier 426 drives the gate of the N-channel MOSFET 422 high enough to turn it on, the Class B control circuit 412 will pull up the gate of the P-channel MOSFET 420 so that it cannot conduct (the P-channel MOSFET 420 isn't needed when the N-channel MOSFET 422 is pulling the input node 416 down to the reference voltage because the external line voltage is positive). As the current through the input node 416 reduces to substantially zero, e.g., the mains line voltage is nearing its zero cross-over, the Class B control circuit 412 will release its 'lock' on the gate of the non-conducting MOSFET 420 or 422. It does this because the gate that is 'unlocked' (the conducting MOSFET) effectively acts as an enable for the lockdown on the other MOSFET gate. As the conducting gate moves towards off (Vgs~Vt), the Class B control circuit 412 releases its lockdown of the 'other' gate.

The current mode detector 414 may comprise a P-channel MOSFET 430, an N-channel MOSFET 434 and an inverter 432. The current mode detector 414 determines when the control voltages, described hereinabove, swing to one of the two rails, e.g., V+ or V−, thereby causing one of the P-channel MOSFET 420 or N-channel MOSFET 422 to turn on and the other to turn off, matching the direction of current flow in the external high value impedance 404. Thus the drive signals applied to the gates of the P-channel MOSFET 420 or N-channel MOSFET 422 may be used as inputs to the N side and P side of a buffer, for example but is not limited to a Schmitt Trigger (ST) buffer structure. Wherein when one input to the current mode detector 414 is in a conducting state, the other input will be hard off (due to the 'lock' from the class B control circuit 412), then the ST will switch rail to rail.

Figure 5:
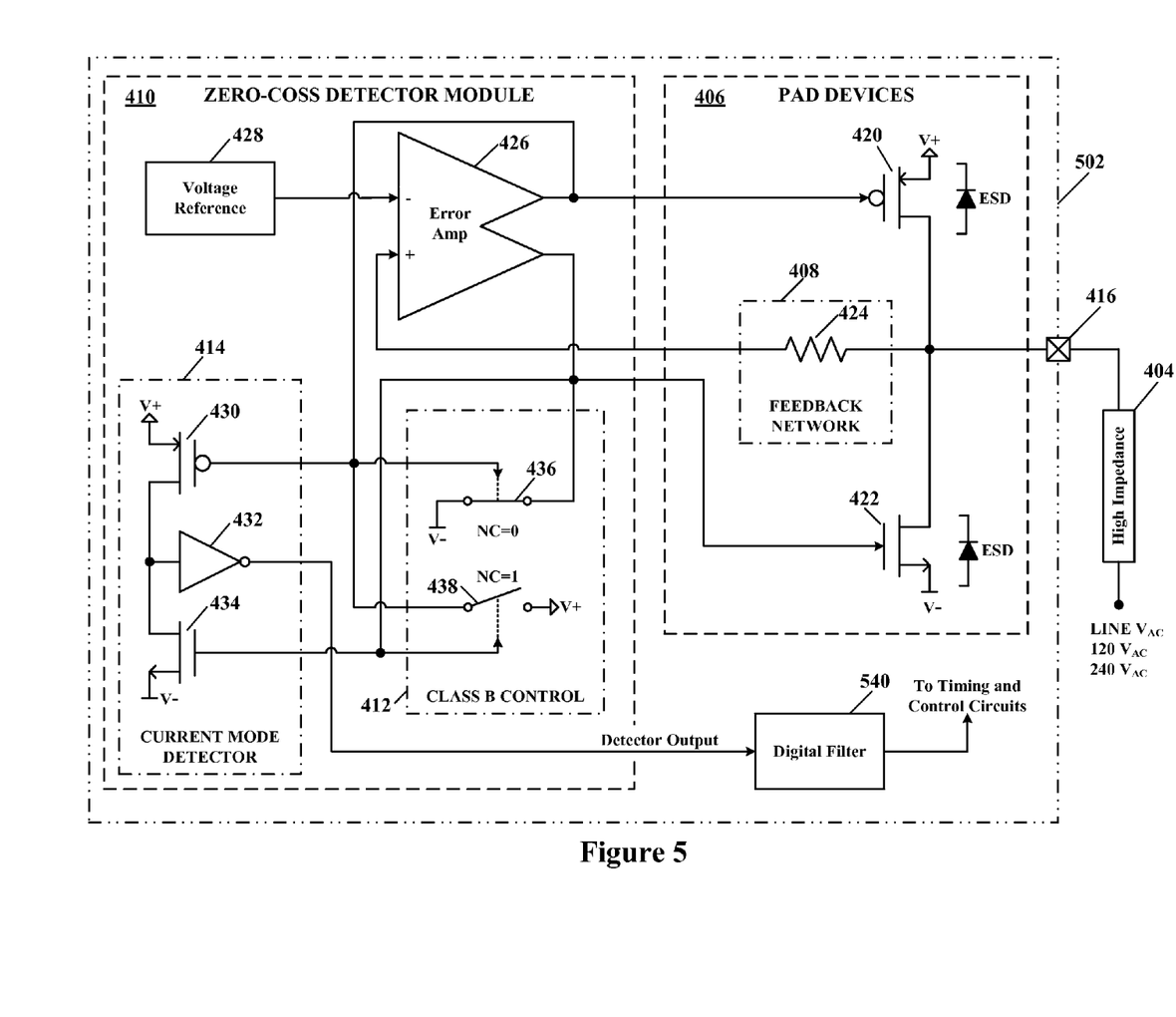
FIG. 5 illustrates a schematic diagram of a mains voltage zero-crossing detector, according to another specific example embodiment of this disclosure.

Referring to FIG. 5, depicted is a schematic diagram of a mains voltage zero-crossing detector, according to another specific example embodiment of this disclosure. A mixed signal device 502, e.g., microcontroller, may function in substantially the same way as the mixed signal device 402, described hereinabove, with the addition of a digital filter 540 receiving the detector output from the inverter 432. The digital filter 540 may be used to hold off for a time that may be substantially less than twice the power line frequency, e.g., half cycle time, but sufficiently long to be 'far' away from a zero cross over point, in order to help avoid any unwanted analog glitches that may occur during the zero crossing decision making process.

It is contemplated and within the scope of this disclosure that a node of an integrated circuit device may be configured for coupling to a mains power alternating current (AC) voltage through a high value impedance at power up or after power up of the integrated circuit device. It is also contemplated and within the scope of this disclosure that a node of an integrated circuit device may be disabled from coupling to a mains power alternating current (AC) voltage through a high value impedance after power up of the integrated circuit device. It is further contemplated and within the scope of this disclosure that at least one configuration fuse may be used to enable the zero cross circuit function without having to execute program code.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A mains voltage zero-crossing detector, comprising:
   a first output driver coupled between an first rail voltage and an external node;
   a second output driver coupled between a second rail voltage and the external node;
   an amplifier having first and second differential inputs, and first and second single ended outputs, wherein a first output thereof is coupled to a control input of the first output driver and a second output thereof is coupled to a control input of the second output driver;
   a feedback network coupled between the external node and the second differential input of the amplifier;
   a voltage reference coupled to the first differential input of the amplifier;
   a class B control circuit coupled to the control inputs of the first and second output drivers, wherein the class B control circuit forces one of the first or second output drivers off when the other output driver is conducting, and releases control back to the amplifier as it stops conducting; and
   a current mode detector circuit coupled to the control inputs of the first and second output drivers, wherein the current mode detector circuit provides mains voltage zero-crossing detection based upon currents applied to the control inputs of the first and second output drivers.

2. The mains voltage zero-crossing detector according to claim 1, wherein the first output driver is a P-channel metal oxide semiconductor field effect transistor (MOSFET) and the second output driver is an N-channel MOSFET.

3. The mains voltage zero-crossing detector according to claim 1, wherein a reference voltage from the voltage reference is between the first and second voltage rails.

4. The mains voltage zero-crossing detector according to claim 1, wherein the class B control circuit overrides one of the first or second single ended outputs of the amplifier to substantially turn off the respective first or second output driver when the other one of the first or second single ended outputs of the amplifier is controlling its respective one of the control inputs of the first or second output driver, thereby substantially reducing shoot through current.

5. The mains voltage zero-crossing detector according to claim 1, wherein the current mode detection circuit comprises an input buffer having separate N-channel MOSFET and P-channel MOSFET inputs coupled to a Schmitt trigger circuit.

6. The mains voltage zero-crossing detector according to claim 1, wherein the amplifier is an operational amplifier.

7. The mains voltage zero-crossing detector according to claim 1, wherein the external node is coupled to a mains voltage through a high impedance.

8. The mains voltage zero-crossing detector according to claim 1, wherein the amplifier comprises a single output and the first and second outputs are provided through first and second resistors coupled to respective control inputs of the first and second output drivers.

9. A microcontroller comprising a circuit arrangement according to claim 1.

10. A circuit arrangement for detecting mains voltage zero-crossings, comprising:
    an external node of an integrated circuit device that is configured for coupling to a mains power alternating current (AC) voltage through a high value impedance;
    first and second output drivers operable to couple the external node to either a first supply rail voltage or second supply rail voltage; and
    a zero-crossing detector providing control of the first and second output drivers such that a substantially constant voltage is forced at the external node whether current is being sinked from or sourced to the mains AC voltage, and a current thereof is monitored in determining voltage zero-crossings of the mains AC voltage.

11. The circuit arrangement according to claim 10, wherein the output drivers are part of a digital input/output port that is programmable to operate the external node as a digital output port, a digital input port, or a zero crossing detector input port.

12. The circuit arrangement according to claim 11, further comprising a configuration register that determines a function of said external node.

13. The circuit arrangement according to claim 10, wherein the constant voltage is controlled by a feedback loop around a class B controlled operational amplifier.

14. The circuit arrangement according to claim 13, wherein the class B controlled first and second output drivers operate power efficiently.

15. The circuit arrangement according to claim 10, wherein the zero-crossing detector is operable to monitor current driven to the first and second output drivers.

16. The circuit arrangement according to claim 15, wherein the zero-crossing detection is independent of operating temperature, process manufacturing and supply voltage.

17. The circuit arrangement according to claim 10, wherein the high value impedance is a high value resistor.

18. The circuit arrangement according to claim 10, wherein the high value impedance is selected from any one or more of the group consisting of a resistor, a capacitor, a transistor, and an inductor.

19. The circuit arrangement according to claim 18, wherein the high value impedance is a combination of passive and active components.

20. The circuit arrangement according to claim 10, further comprising a digital filter coupled to the zero-crossing detector.

21. The circuit arrangement according to claim 20, wherein the digital filter has a hold off time of substantially less than twice the mains power AC frequency.

22. A microcontroller comprising a circuit arrangement according to claim 10.

23. A method for detecting mains voltage zero-crossings, said method comprising the steps of:
 configuring an external node of an integrated circuit device for coupling to a mains power alternating current (AC) voltage through a high value impedance;
 providing first and second output drivers operable to couple the external node to either a first supply rail voltage or second supply rail voltage; and
 providing a zero-crossing detector to control of the first and second output drivers such that a substantially constant voltage is forced at the external node whether current is being sinked from or sourced to the mains AC voltage; and
 monitoring current of signals controlling the first and second output drivers for determining voltage zero-crossings of the mains AC voltage.

24. The method according to claim 23, further comprising the step of filtering the monitored current of the signals controlling the first and second output drivers with a digital filter.

25. The method according to claim 24, wherein the digital filter has a hold off time of substantially less than twice the mains power AC frequency.

26. The method according to claim 23, wherein the step of configuring the node of the integrated circuit device for coupling to the mains power alternating current (AC) voltage through the high value impedance is done at power up of the integrated circuit device.

27. The method according to claim 23, wherein the step of configuring the external node of the integrated circuit device for coupling to the mains power alternating current (AC) voltage through the high value impedance is done after power up of the integrated circuit device.

28. The method according to claim 23, further comprising the step of disabling the external node of the integrated circuit device coupled to the mains power alternating current (AC) voltage through the high value impedance after power up of the integrated circuit device.

29. The method according to claim 23, wherein the step of configuring the external node of the integrated circuit device for coupling to the mains power alternating current (AC) voltage through the high value impedance is done with at least one configuration fuse without having to execute a program code.

\* \* \* \* \*